United States Patent
Francis

(10) Patent No.: US 8,854,085 B1
(45) Date of Patent: Oct. 7, 2014

(54) METHOD AND APPARATUS FOR CANCELLATION OF THE SECOND HARMONIC IN A DIFFERENTIAL SAMPLING CIRCUIT

(71) Applicant: Texas Instruments Incorporated, Dallas, TX (US)

(72) Inventor: Roswald Francis, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/890,031

(22) Filed: May 8, 2013

(51) Int. Cl.
 *G11C 27/02* (2006.01)

(52) U.S. Cl.
 USPC ............ 327/91; 327/94; 327/95; 327/96; 327/337

(58) Field of Classification Search
 USPC .................... 327/91, 94–96, 337
 See application file for complete search history.

(56) References Cited

U.S. PATENT DOCUMENTS 5,909,131 A * 6/1999 Singer et al. ............ 327/91
6,882,292 B1 * 4/2005 Bardsley et al. ......... 341/121

* cited by examiner

*Primary Examiner* — Kenneth B. Wells
(74) *Attorney, Agent, or Firm* — Alan A. R. Cooper; Frederick J. Telecky, Jr.

(57) ABSTRACT

A compensation circuit for eliminating harmonic content resulting from a phase imbalance in a differential sampling circuit. The compensation circuit includes a pair of field effect transistors operating in saturation mode, each field effect transistor coupled in parallel with the differential switch of the sampling circuit, which operates in linear mode. The saturation region transistors across the differential switch allow the harmonic content to flow through the compensation circuit instead of the sampling capacitors of the sampling circuit.

13 Claims, 3 Drawing Sheets

METHOD AND APPARATUS FOR CANCELLATION OF THE SECOND HARMONIC IN A DIFFERENTIAL SAMPLING CIRCUIT

TECHNICAL FIELD

The present disclosure relates generally to analog-to-digital converters, and more particularly, to circuits and methods for cancelling harmonics caused by phase imbalance in differential sampling circuits.

BACKGROUND

An analog-to-digital converter (ADC) is used to generate a sequence of digital codes representing the strength of an input signal at corresponding points in time. An ADC may be implemented in various well-known forms, such as successive approximation (SAR) ADC, pipelined ADC, etc.

The term "Spurious-Free Dynamic Range" (SFDR) of an ADC generally quantifies the extent to which harmonic content is present in the output of the ADC. Ideally, harmonic content should be absent in the ADC output. According to one convention, SFDR is referred to as the ratio of the RMS (root mean squared) amplitude of the carrier frequency (maximum signal component or fundamental frequency) to the RMS value of the next largest noise or harmonic distortion component (component having a frequency an integer number of times the carrier frequency). SFDR may be measured in dBc (decibels with respect to the carrier frequency amplitude) or in dBFS (decibels with respect to the ADC's full-scale range). Using this definition, SFDR should ideally have an infinite value.

Several factors may contribute to a low SFDR in an ADC. For example, a sample and hold circuit at the input of an ADC may cause the generation of harmonic components because of the inherent non-linearity of the MOS sampling switches, junction diodes, and sampling glitches. The second harmonic HD2 and the third harmonic HD3 are often the dominant components affecting the SFDR at high input frequencies.

Therefore, it would be desirable to eliminate the harmonic content in order to improve the SFDR of an ADC.

DETAILED DESCRIPTION

The present disclosure is directed to a compensation circuit for reducing or eliminating second harmonic content resulting from a phase imbalance in a differential sampling circuit due to the differential switch. The input imbalance in a differential circuit is caused by several factors such as board mismatch, driving transformer mismatch, etc. The compensation circuit provides field effect transistors operating in a saturation mode coupled in parallel with the differential switch of the sampling circuit, which operates in a linear mode. By placing a saturation region transistor across the differential switch, the harmonic content does not flow through the sampling capacitors of the sampling circuit, but instead, flows through the compensation circuit.

Figure 1:
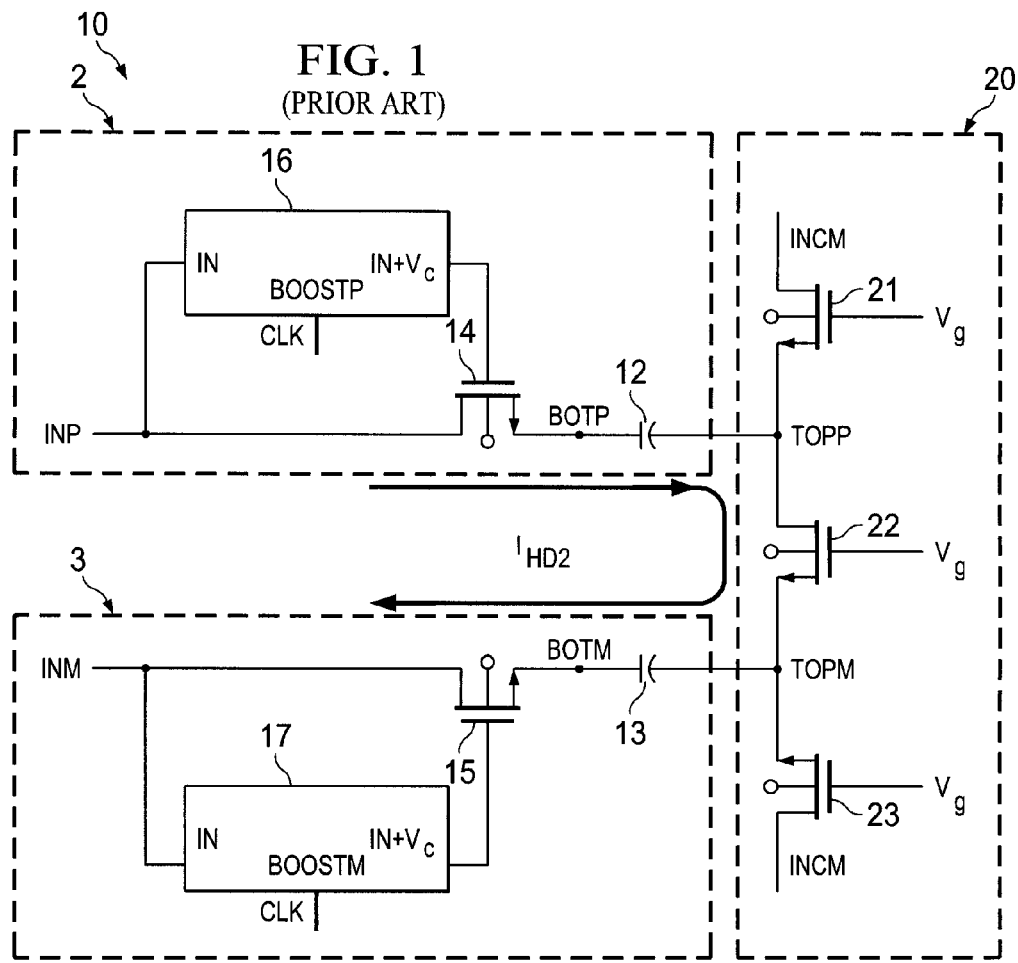
FIG. 1 is a schematic diagram illustrating the front end of a conventional sampling circuit for an analog-to-digital converter.

FIG. 1 illustrates a typical embodiment of a known sampling circuit 10 for differential inputs INP and NM, as used, for example, in the front end of an analog-to-digital converter (ADC). FIG. 1 is a simplified representation and intended to be illustrative only. Additional circuitry will be required to implement a specific ADC or other application. For example, an RCR filter (not shown) is commonly used to shunt the two inputs INP and INM in order to set the analog bandwidth of the sampling circuit 10; an RLC network (not shown) may be used to represent package parasitics; and one or more amplifiers and/or other processing and logic circuitry will follow the sampling circuit to store and further process the signals being sampled.

A pair of input stages 2 and 3 feed input signals INP and INM to a pass-through network 20, where the signals will be passed on to the rest of the ADC circuit (not shown). In the input stages 2, 3, sampling capacitors 12 and 13 are coupled in series with corresponding sampling switches 14 and 15 to receive and temporarily store differential inputs INP and NM. The sampling switches 14, 15 (as well as other switches described herein) are implemented with field-effect transistors, as shown in the figures, with sizes chosen such that the bandwidth of the circuit is much greater than the highest input frequency of interest. The gates of the sampling switches 14, 15 are driven by boost circuits 16 and 17, respectively. Each of the boost circuits 16, 17 takes its respective input signal (INP or INM) and generates an output signal equal to the input level shifted by $V_C$ (shown as $IN+V_C$ in the BOOST circuits), where $V_C$ is a constant voltage, when the clock signal CLK is high. When the clock signal CLK is low, each of the boost circuits 16, 17 generates a zero or low level output. In this way, the sampling switches 14, 15 see signal independent gate to source voltage (shown as $V_C$ in FIG. 1) and therefore signal independent switch resistance while transmitting the input signals.

In the pass-through network 20, the pair of nodes INCM are driven by a voltage source (not shown) having a value defined by the circuit following this sampling stage, e.g., typically an amplifier circuit, and the voltage INCM is passed into the circuit by two single-ended switches 21 and 23.

Ideally in a differential sampling circuit, even harmonics are not present. However, if the phase difference between differential inputs INP and INM is different from 180 degrees, i.e., then there is a phase imbalance, and the differential closing switch 22 generates a second harmonic current $I_{HD2}$ as indicated in FIG. 1. The current $I_{HD2}$ representing harmonic content multiplied by the capacitor impedance creates a voltage drop across the sampling capacitors 12, 13. Further, it is typical for the single-ended switches 21, 23 to be made much smaller (on the order of ½ smaller) than the differential switch 22 for the same length. Thus, the contribution of harmonic content HD2 due to the differential switch 22 dominates since the HD2 current is proportional to width for a particular voltage swing across the transistor. However, as described below, the non-linearity associated with the differential switch 22 operating in its linear region can be cancelled by adding a similar transistor in parallel operating in its saturation region.

Figure 2:
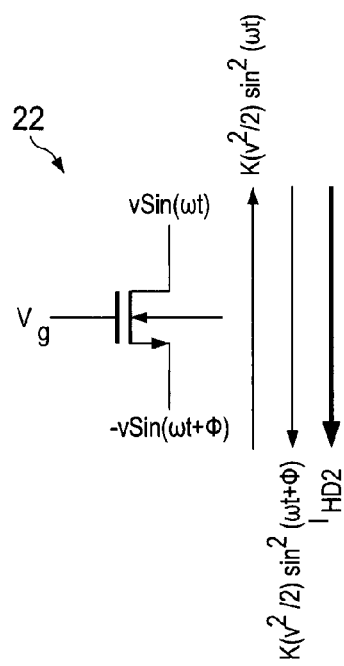
FIG. 2 is a portion of the schematic diagram of FIG. 1 illustrating the generation of harmonic content in the differential switch due to phase imbalance.

FIG. 2 illustrates how the second harmonic content is generated due to phase imbalance. The current through switch 22 operating in its linear region is given by the following equations:

$$I_{DS}=(K/2)((V_{GS}-V_T)V_{DS}-V_{DS}^2/2),$$

where $K=\mu_n C_{OX}(W/L)$ and $\Phi$ is the phase imbalance due to input phase imbalance ($C_{OX}$ is the gate oxide capacitance per area);

$$V_{GS}=V_g+v\sin(\omega t+\Phi))-V_{INCM},$$

where $V_{INCM}$ is the DC operating point at the drain and source of transistor 22, and $V_g$ is a constant voltage sufficient to keep transistor 22 in deep inversion;

$$V(TOPP)=V_{INCM}+v\sin(\omega t);$$

$$V(TOPM)=V_{INCM}-v\sin(\omega t+\Phi); \text{ and}$$

$$V_{DS}=V(TOPP)-V(TOPM)=v\sin(\omega t)+v\sin(\omega t+0).$$

Substituting for $V_{GS}$ and $V_{DS}$ and solving for the second harmonic term yields:

$$I_{HD2}=K(v^2/2)\sin^2(\omega t+\Phi)-K(v^2/2)\sin^2(\omega t),$$

where the current $I_{HD2}$ flows from drain (node TOPP) to source (node TOPM) of transistor 22. As expected, $\Phi=0$, therefore $I_{HD2}=0$. From these equations, $I_{HD2}$ is proportional to $Kv^2$, where K is proportional to W and v is proportional to 1/W. Therefore, $I_{HD2}$ is proportional to 1/W.

This means that in order to reduce the harmonic current $I_{HD2}$, the width W of transistor 22 has to be increased. However, increasing the width W of transistor 22 also increases parasitics at the nodes TOPP and TOPM, and this makes the specification for the subsequent amplifier circuit much tighter. However, a cancellation method will now be described, which has the advantage of less parasitic capacitance at the nodes TOPP and TOPM, with a theoretically complete cancellation of harmonic content.

Figure 3:
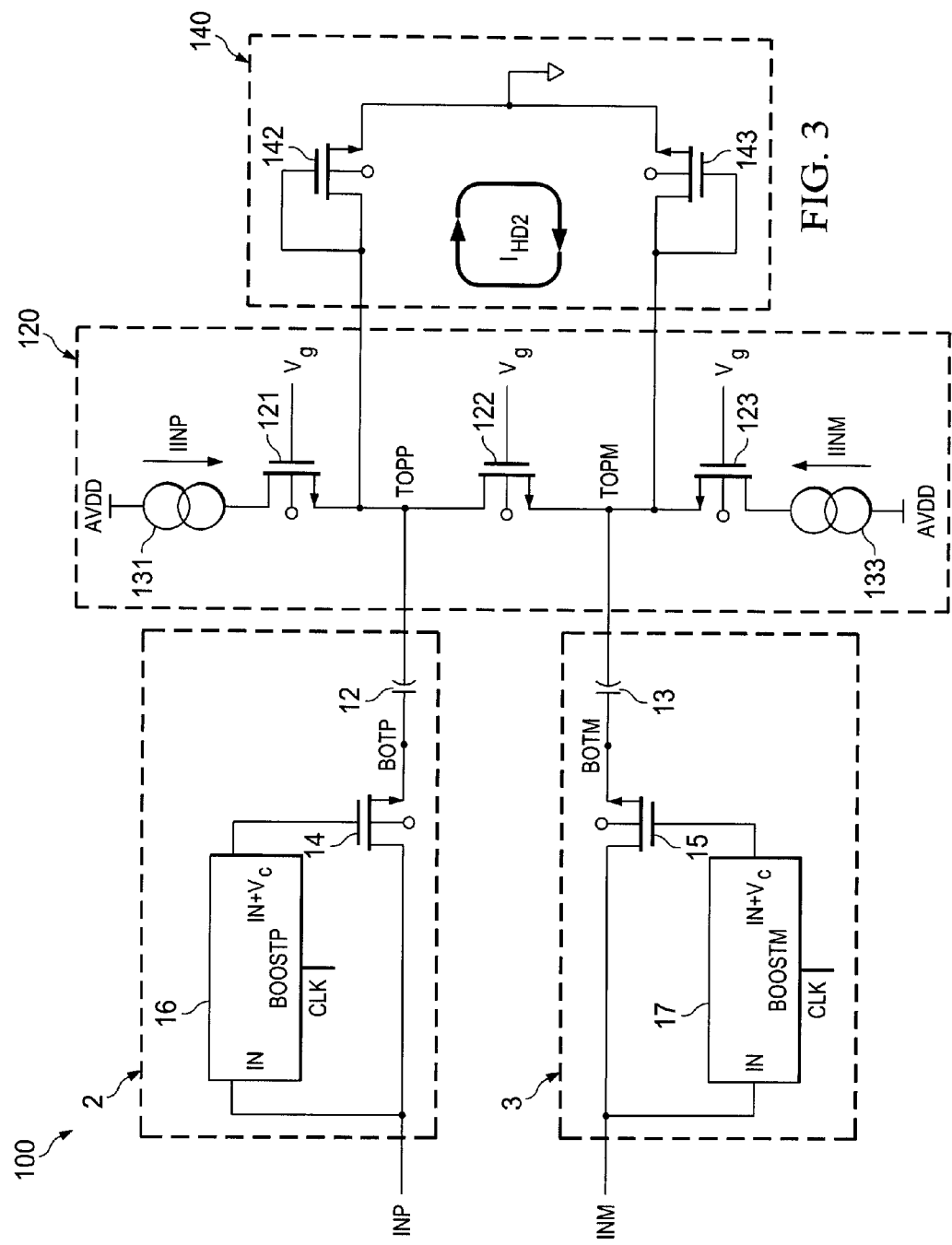
FIG. 3 is a schematic diagram illustrating a sampling circuit having compensation for harmonic content generated in the differential switch.

In the sampling circuit 100 of FIG. 3, the pass-through network 120 is basically the same as network 20, with differential transistor 122 operating in a linear region and bounded on either end by the single ended switches 121 and 123. The drain of single ended switch 121 is coupled to current source IINP, which is coupled to voltage AVDD, while the drain of single ended switch 123 is coupled to current source IINM, which is also coupled to voltage AVDD. A compensation network 140 is added in parallel with the pass-through network 120. More specifically, the compensation network 140 adds two compensation transistors 142 and 143 each having the same width W and length L as the differential transistor 122. Current sources 131 and 133 are DC current sources sufficiently sized to operate the compensation transistors 142, 143 in a saturation region under the swing across the differential switch 122.

The expression for the harmonic current $I_{HD2}$ described above has two components, namely, $K(v^2/2)\sin^2(\omega t+\Phi)$ and $K(v^2/2)\sin^2(\omega t)$. These two harmonic components can be cancelled by the parallel compensation network 140 shown in FIG. 3. The single-ended transistors 121, 123 acts like switches in the current path, and in the discrete time domain, the current can be switched off using the single-ended transistors.

In general, the current through a transistor in saturation region is given by:

$$I_{DS}=(K/2)(VGS-V_T)^2.$$

Thus, the current through the single-ended transistor 142 is given by:

$$I_{DS}^{142}=(K/2)(V_{INCM}+v\sin(\omega t+\Phi)-V_T)^2.$$

Solving for the second harmonic term in this equation yields:

$$I_{HD2}^{142}=K(v^2/2)\sin^2(\omega t),$$

which flows from the node TOPP to ground.

Similarly, current through the single-ended transistor 143 is given by:

$$I_{DS}^{143}=(K/2)(V_{INCM}-v\sin(\omega t+\Phi)-V_T)^2.$$

Solving for the second harmonic term in this equation yields:

$$I_{HD2}^{143}=K(v^2/2)\sin^2(\omega t+\Phi),$$

which flows from the node TOPM to ground.

Thus, the total harmonic current $I_{HD2}'$ flowing from node TOPM to node TOPP is:

$$I_{HD2}'=I_{HD2}^{143}-I_{HD2}^{142}.$$

Therefore, $I_{HD2}'=K(v^2/2)\sin^2(\omega t+\Phi)-K(v^2/2)\sin^2(\omega t)=I_{HD2}$.

Therefore, using this solution, the harmonic current $I_{HD2}$ circulates within the compensation circuit 140 and transistor 122, as shown in FIG. 3, and does not flow to the input or create HD2 voltage. Since the swing across the differential switch transistor 122 is very small, the amount of third harmonic current HD3 generated at the differential switch is negligible using this solution. In fact, this solution reduces the third harmonic current HD3 generated by transistor 122 as the compensation circuit linearizes the impedance of transistor 122. The performance of this circuit has been verified using the PSP (physical surface potential) model to simulate all transistors, since the PSP model best defines the linearity associated with a switch around VDS=0.

For example, Table I below shows the transistor sizes and values of the sampling capacitors and current sources, as used in a circuit simulation for the circuit shown in FIG. 3:

TABLE I

| Element | Size |
| --- | --- |
| Transistor 14 | 206 µm W × 0.25 µm L |
| Transistor 15 | 206 µm W × 0.25 µm L |
| Transistor 121 | 8.4 µm W × 0.21 µm L |
| Transistor 123 | 8.4 µm W × 0.21 µm L |
| Transistor 122 | 151 µm W × 0.21 µm L |
| Transistor 142 | 151 µm W × 0.21 µm L |
| Transistor 143 | 151 µm W × 0.21 µm L |
| Capacitor 12 | 2 pF |
| Capacitor 13 | 2 pF |
| Current source 131 | 1.8 mA |
| Current source 133 | 1.8 Ma |

In order to exclude non-linearity associated with source/drain junction capacitors of sampling transistors 14 and 15, an ideal differential voltage source is assumed, and a differential 2V peak-to-peak input is applied with a common mode of 0.95V. The supply used is 1.8V. The boost circuits 16 and 17 present an ideal boost, which shifts the level of the input by 1.7V. Voltage $V_{INCM}$ is 0.88V.

Figure 4:
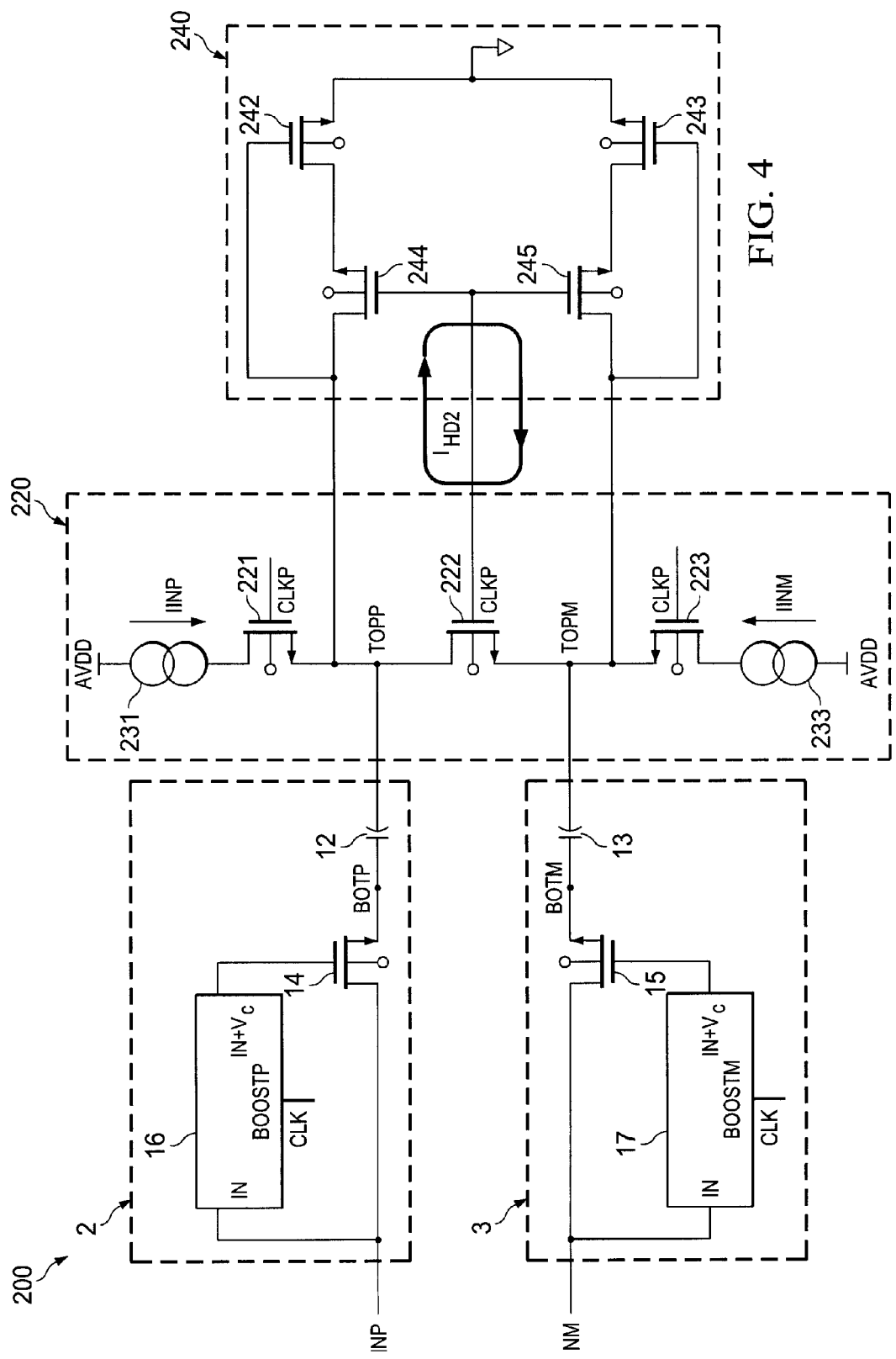
FIG. 4 is a schematic diagram illustrating a discrete alternative sampling circuit with compensation for harmonic content.

FIG. 4 illustrates a complete discrete time domain version of sampling circuit 200. In sampling circuit 200, the pass-through network 220 is basically the same as network 120, except that the gates of differential transistor 222 and single ended switches 221 and 223 are driven with a clock pulse CLKP rather than voltage $V_g$.

Two MOS switches 244 and 245 are added at the drain side of compensation transistors 242 and 243, respectively, and are used to switch off the compensation transistors. The MOS switches 244, 245 can be small in size because the current drawn by the compensation transistors 242, 243 depends on $V_{GS}$. A small second order effect is present due to the finite $g_{ds}$ associated with the compensation transistors. Since the differential switch 222, the single-ended switches 221, 223, and the MOS switches 244, 245, all see the same bias voltage, the switching off condition is the same as in FIG. 1.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. A differential sampling circuit, comprising:
    a pair of input stages each having a sampling switch coupled to a differential input signal and a sampling capacitor having an input coupled in series with the sampling switch and an output;
    a pass-through network shunting the input stages between the outputs of the sampling capacitors, the pass-through network comprising a plurality of field effect transistors operating in a linear region;
    a cancellation network coupled in parallel with the pass-through network, the cancellation network comprising a plurality of field effect transistors operating in a saturation region,
    wherein each sampling switch is a field effect transistor having a gate coupled to the input signal, a drain coupled to the input signal, and a source coupled to the input of the sampling capacitor, and
    a pair of boost circuits, each boost circuit coupled between the input signal and the gate of the field effect transistor.

2. The differential sampling circuit of claim 1, wherein the pass-through network comprises:
    a first current source coupled to a first voltage source;
    a first field effect transistor coupled between the first current source and the output of the capacitor from one of the input stages;
    a second current source coupled to the first voltage source;
    a second field effect transistor coupled between the second current source and the output of the capacitor from the other of the input stages; and
    a third field effect transistor coupled between the outputs of the capacitors from both input stages.

3. The differential sampling circuit of claim 2, wherein the cancellation network comprises:
    a fourth field effect transistor coupled between the output of the capacitor from a first one of the input stages and ground; and
    a fifth field effect transistor coupled between the output of the capacitor from a second one of the input stages and ground.

4. The differential sampling circuit of claim 3, wherein each of the fourth and fifth field effect transistors are formed to have the same channel width and length as the third field effect transistor.

5. The differential sampling circuit of claim 3, wherein the fourth and fifth field effect transistors each have a drain and a gate commonly coupled to respective capacitor outputs.

6. The differential sampling circuit of claim 5, the cancellation network further comprising:
    a sixth field effect transistor having a gate coupled to the gate of the third field effect transistor, a drain coupled to the output of the capacitor from the first input stage, and a source coupled to the drain of the fourth field effect transistor, wherein the drain of the fourth field effect transistor is not coupled to the capacitor output of the first stage; and
    a seventh field effect transistor having a gate coupled to the gate of the third field effect transistor, a drain coupled to the output of the capacitor from the second input stage, and a source coupled to the drain of the fifth field effect transistor, wherein the drain of the fifth field effect transistor is not coupled to the capacitor output of the second stage.

7. The differential sampling circuit of claim 2, wherein the cancellation network comprises:
    a fourth field effect transistor having a gate coupled to the output of the capacitor from a first one of the input stages, a source coupled to ground, and a drain;
    a fifth field effect transistor having a gate coupled to the output of the capacitor from a second one of the input stages, a source coupled to ground, and a drain;
    a sixth field effect transistor having a gate coupled to the pass-through network, a drain coupled to the output of the capacitor from the first input stage, and a source coupled to the drain of the fourth field effect transistor;
    a seventh field effect transistor having a gate coupled to the pass-through network, a drain coupled to the output of the capacitor from the second input stage, and a source coupled to the drain of the sixth field effect transistor.

8. The differential sampling circuit of claim 7, wherein the pass-through network comprises:
    a first current source coupled to a first voltage source;
    an eighth field effect transistor coupled between the first current source and the output of the capacitor from the first input stage;
    a second current source coupled to the first voltage source;
    a ninth field effect transistor coupled between the second current source and the output of the capacitor from the second input stage; and
    a third field effect transistor coupled between the outputs of the capacitors from both input stages, wherein the gates of the sixth and seventh field effect transistors are coupled to a gate of the third field effect transistor.

9. The differential sampling circuit of claim 7, wherein the fourth and fifth field effect transistors are formed with the same area as the third field effect transistor.

10. A differential sampling circuit, comprising:
    a first field effect transistor coupled to a first differential input signal;
    a first sampling capacitor coupled in series with the first field effect transistor;
    a second field effect transistor coupled to a second differential input signal;
    a second sampling capacitor coupled in series with the second field effect transistor;
    a third field effect transistor having a drain coupled to an output of the first sampling capacitor, a source coupled to an output of the second sampling capacitor, and a gate coupled to a reference voltage;
    a fourth field effect transistor having a drain coupled to a first current source, a source coupled to the output of the first sampling capacitor, and a gate coupled to the reference voltage;

a fifth field effect transistor having a drain coupled to a second current source, a source coupled to the output of the second sampling capacitor, and a gate coupled to the reference voltage;

a sixth field effect transistor having a gate and a drain commonly coupled to the output of the first sampling capacitor, and a source coupled to ground; and a seventh field effect transistor having a gate and a drain commonly coupled to the output of the second sampling capacitor, and a source coupled to ground;

wherein the third, fourth and fifth field effect transistors are operated in a linear region and the sixth and seventh field effect transistors are operated in a saturation region.

11. The differential sampling circuit of claim 10, further comprising:

wherein the drain of the sixth field effect transistor is coupled to a source of an eighth field effect transistor, the eighth field effect transistor also having a gate coupled to the gate of the third field effect transistor, and a drain coupled to the output of the first sampling capacitor;

wherein the drain of the seventh field effect transistor is coupled to a source of a ninth field effect transistor, the ninth field effect transistor also having a gate coupled to the gate of the third field effect transistor, and a drain coupled to the output of the second sampling capacitor.

12. The differential sampling circuit of claim 10, further comprising:

a first boost circuit coupled between the first differential input signal and a gate of the first field effect transistor; and a second boost circuit coupled between the second differential input signal and a gate of the second field effect transistor.

13. The differential sampling circuit of claim 10, wherein the sixth and seventh field effect transistors are formed with the same area as the third field effect transistor.

* * * * *